(12) United States Patent
Xiong et al.

(10) Patent No.: US 11,874,575 B2
(45) Date of Patent: Jan. 16, 2024

(54) DISPLAY PANEL HAVING FIRST AND SECOND WIRES EXTENDED AND ARRANGED IN THE SAME DIRECTION IN THE BEZEL REGION

(71) Applicant: SHENZHEN CHINA STAR OPTOELECTRONICS SEMICONDUCTOR DISPLAY TECHNOLOGY CO., LTD., Guangdong (CN)

(72) Inventors: Jue Xiong, Guangdong (CN); Bangyin Peng, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 600 days.

(21) Appl. No.: 16/972,030

(22) PCT Filed: Nov. 24, 2020

(86) PCT No.: PCT/CN2020/131157
§ 371 (c)(1),
(2) Date: Dec. 4, 2020

(87) PCT Pub. No.: WO2022/041520
PCT Pub. Date: Mar. 3, 2022

(65) Prior Publication Data
US 2022/0057667 A1    Feb. 24, 2022

(30) Foreign Application Priority Data
Aug. 24, 2020 (CN) .......................... 202021774037.7

(51) Int. Cl.
*G02F 1/1362* (2006.01)
*G02F 1/1345* (2006.01)
*H01L 27/12* (2006.01)

(52) U.S. Cl.
CPC ...... *G02F 1/13629* (2021.01); *G02F 1/13454* (2013.01); *G02F 1/136227* (2013.01); *H01L 27/124* (2013.01)

(58) Field of Classification Search
CPC ............ G02F 1/13629; G02F 1/13454; G02F 1/136227; H01L 27/124
See application file for complete search history.

(56) References Cited

U.S. PATENT DOCUMENTS

2007/0153209 A1   7/2007   Moon
2022/0328527 A1*   10/2022   Zhao .................... G09G 3/3677

FOREIGN PATENT DOCUMENTS

CN    101846828 A   *   9/2010
CN    104570527 A   *   4/2015   ....... G02F 1/133345
(Continued)

*Primary Examiner* — Ermias T Woldegeorgis
(74) *Attorney, Agent, or Firm* — The Roy Gross Law Firm, LLC; Roy Gross (57) ABSTRACT

A display panel is provided. At least two first wires in a second direction are electrically connected to each other and at least two second wires in the second direction are electrically connected to each other. The space in the second direction is fully used to arrange the first wires and the second wires to ensure the number of first via holes disposed corresponding to the first wires and the number of second via holes disposed corresponding to the second wire, thereby ensuring the connectivity of a transparent conductive block that bridges the first wires and the second wires through the first via holes and the second via holes.

18 Claims, 5 Drawing Sheets

(56) References Cited

FOREIGN PATENT DOCUMENTS

| | | | | |
|---|---|---|---|---|
| CN | 104617106 A | * | 5/2015 | ........... G02F 1/1345 |
| CN | 204595383 U | | 8/2015 | |
| CN | 107490913 A | | 12/2017 | |
| CN | 111384066 A | * | 7/2020 | ........... G09G 3/3677 |
| CN | 111384066 A | | 7/2020 | |
| CN | 211577626 U | | 9/2020 | |
| JP | 3208658 B2 | * | 9/2001 | ........... G02F 1/1368 |

\* cited by examiner

DISPLAY PANEL HAVING FIRST AND SECOND WIRES EXTENDED AND ARRANGED IN THE SAME DIRECTION IN THE BEZEL REGION

FIELD OF INVENTION

The present disclosure relates to the field of display technologies, and more particularly, to a display panel.

BACKGROUND OF INVENTION

At present, 8K (resolution: 7680×4320) display products generally require extremely narrow bezels. Such products usually require sealants to be placed directly on buslines of gate drive circuits (gate on array, GOA) in bezel regions to save space. However, the placement of the sealant directly on the buslines of the gate drive circuits requires a high aperture ratio for busline design. Low aperture ratios and large metal blocks may cause the sealant to be incompletely cured, which leads to problems, such as uneven brightness (mura) around the periphery when the display panel is displaying.

Figure 1:
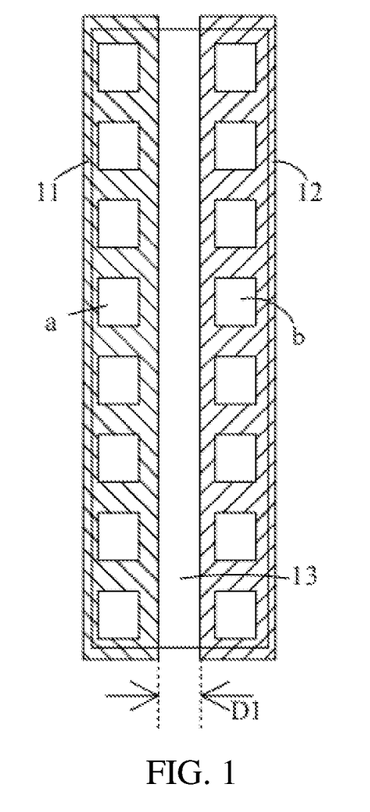
FIG. 1 is a schematic plan view of wirings of a conventional gate drive circuit.
Figure 2:
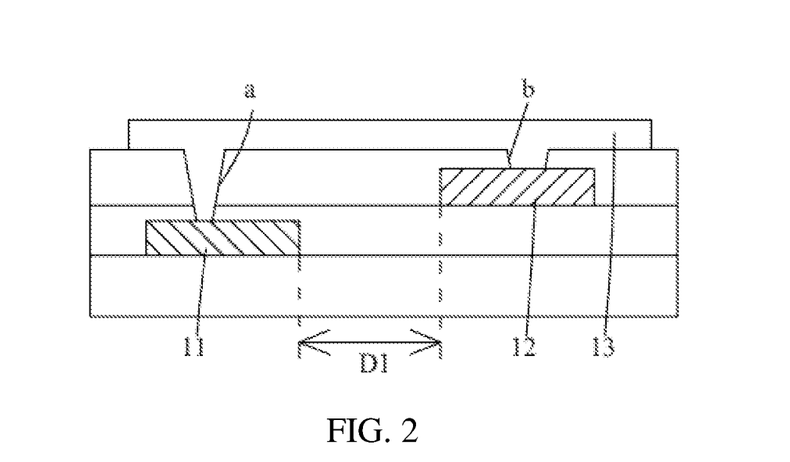
FIG. 2 is a schematic partial cross-sectional view of the gate drive circuit shown in FIG. 1.

As shown in FIGS. 1 and 2, FIG. 1 is a schematic plan view of wirings of a conventional gate drive circuit, and FIG. 2 is a schematic partial cross-sectional view of the gate drive circuit shown in FIG. 1. The wirings of the gate drive circuit include a first metal wiring 11, a second metal wiring 12, and an indium tin oxide layer 13. The indium tin oxide layer 13 bridges the first metal wiring 11 and the second metal wiring 12. There is a gap D1 between the first metal wiring 11 and the second metal wiring 12. The gap D1 is used for ensuring an aperture ratio to increase the curing degree of the sealant. A first insulating layer is disposed between the first metal wiring 11 and the second metal wiring 12. A second insulating layer is disposed between the second metal wiring 12 and the indium tin oxide layer 13. The indium tin oxide layer 13 is electrically connected to the first metal wire 11 by a via hole a that passes through the first insulating layer and the second insulating layer. The indium tin oxide layer 13 is electrically connected to the second metal wire 12 by a via hole b that passes through the second insulating layer. However, the wiring design of the gate drive circuit shown in FIG. 1 is only suitable for products having large product sizes, sufficient vertical space, and low requirements for the number of via holes and conductivity. It is not suitable for 8K products having small sizes, insufficient longitudinal space, high requirements for number of via holes and high conductivity.

SUMMARY OF INVENTION

Technical Problems

A purpose of the present disclosure is to provide a display panel so that the arrangement of wirings of a gate drive circuit and the design of via holes corresponding to the wiring fully use the space in a second direction, which saves the space in a first direction. Therefore, a connectivity of a transparent conductive block that bridges first wires and second wires through first via holes and second via holes is ensured.

In order to achieve the above object, the present disclosure provides a display panel, comprising a bezel region, wherein the display panel comprises:

a plurality of first wires extending along a first direction and arranged side by side along a second direction, wherein the first wires are disposed in the bezel region, and at least two of the first wires are electrically connected to each other;

a first insulating layer positioned on one side of the first wires;

a plurality of second wires extending along the first direction and arranged side by side along the second direction, wherein the second wires are disposed in the bezel region and are positioned on one side of the first insulating layer away from the first wires, and at least two of the second wires are electrically connected to each other;

a second insulating layer positioned on a side of the second wires away from the first insulating layer;

a plurality of first via holes passing through the first insulating layer and the second insulating layer, wherein the first via holes are defined corresponding to the first wires;

a plurality of second via holes passing through the second insulating layer, wherein the second via holes are defined corresponding to the second wires; and at least one transparent conductive block positioned on one side of the second insulating layer away from the second wires, wherein the same transparent conductive block is electrically connected to at least one of the first wires through the first via hole and is electrically connected to at least one of the second wires corresponding to the first wires through the second via hole.

In the aforementioned display panel, one of the first wires is positioned between adjacent two of the second wires in the second direction, and each of the first wires corresponds to one of the second wires adjacent to the first wire in the second direction.

In the aforementioned display panel, the same transparent conductive block is electrically connected to adjacent two of the first wires in the second direction through the first via hole, and is electrically connected to the two adjacent second wires in the second direction through the second via hole.

In the aforementioned display panel, further comprising at least one connecting wire disposed in the bezel region, and the two adjacent second wires in the second direction are electrically connected to each other by the at least one connecting wire.

In the aforementioned display panel, the connecting wire and the second wires are positioned on a same layer.

In the aforementioned display panel, the two adjacent second wires in the second direction are electrically connected to each other by two connecting wires, both ends of each of the connecting wires are connected to a corresponding end of the two adjacent second wires, the two connecting wires that are electrically connected to the two adjacent second wires are symmetrically arranged with respect to a symmetrical axis of the second wires parallel to the second direction, and an included angle between the first direction and the second direction is equal to 90 degrees.

In the aforementioned display panel, a width of each of the connecting wires ranges from 5 μm to 15 μm.

In the aforementioned display panel, the width of each of the first wires ranges from 40 μm to 80 μm, the width of each of the second wires ranges from 40 μm to 80 μm, and a width of a distance between each of the first wires and the second wire adjacent to the first wire in the second direction ranges from 20 μm to 40 μm.

In the aforementioned display panel, a width of each of the first wires is equal to a width of each of the second wires.

In the aforementioned display panel, the display panel further comprises a sealant disposed in the bezel region and positioned on one side of the at least one transparent conductive block away from the second insulating layer.

Beneficial Effects

By electrically connecting at least two first wires in the second direction and electrically connecting at least two second wires in the second direction, the display panel of the present disclosure fully uses the space in the second direction to arrange the first wires and the second wires. The space occupied by the first wires and the second wires in the first direction is reduced, so that the number of the first via holes corresponding to the first wires and the number of the second via holes corresponding to the second wires in the second direction are increased, and the number of the first via holes corresponding to the first wires and the number of the second via holes corresponding to the second wires in the first direction are decreased, to ensure the number of the first via holes corresponding to the first wires and the number of the second via holes corresponding to the second wires, thereby ensuring the conductivity of the transparent conductive block that bridges the first wires and the second wires by the first via holes and the second via holes. In addition, the first wires and the second wires are alternately arranged in the second direction to ensure an aperture ratio between the first wires and the second wires, which is beneficial to the sufficient curing of the sealant.

DETAILED DESCRIPTION OF PREFERRED EMBODIMENTS

The technical solutions of the embodiments of the present disclosure will be illustrated completely and clearly in combination with the following drawings of the embodiments of the disclosure. Apparently, the described embodiments are merely a few rather than all of the embodiments of the present disclosure. All other embodiments obtained by persons of ordinary skill in the art based on the embodiment of the present disclosure without creative efforts shall fall within the protection scope of the present disclosure.

Figure 3:
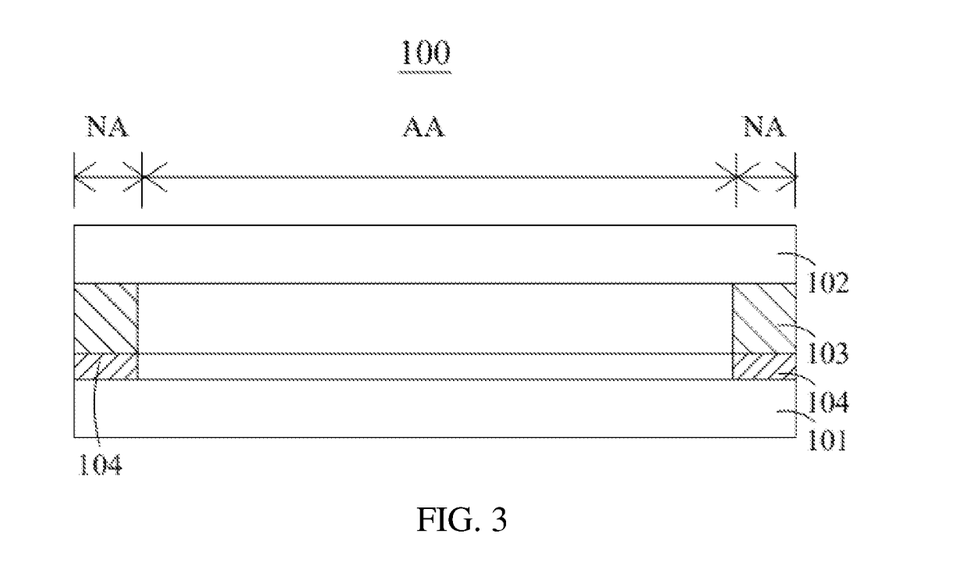
FIG. 3 is a schematic view of a display panel according to an embodiment of the present disclosure.

Please refer to FIG. 3. FIG. 3 is a schematic view of a display panel according to an embodiment of the present disclosure. The display panel 100 is a liquid crystal display panel. The display panel includes an array substrate 101, a color filter substrate 102, and a sealant 103 disposed between the array substrate 101 and the color filter substrate 102.

The display panel 100 has a display area AA and a bezel region NA that is positioned at a periphery of the display area AA. The display area AA of the display panel 100 includes a plurality of display pixels (not shown). The display pixels include a driving circuit. The driving circuit includes a plurality of thin film transistors (not shown) arranged in an array. The display pixels also include a pixel electrode disposed on the array substrate 101. The pixel electrode is electrically connected to a drain of the thin film transistor. The bezel region NA of the display panel 100 includes a gate drive circuit 104. The gate drive circuit 104 is used for outputting a gate control signal for controlling the turn-on and turn-off of the thin film transistor. The sealant 103 is disposed in the bezel region NA of the display panel 100 and is positioned directly on the gate drive circuit 104. The sealant 103 is obtained by coating an uncured adhesive on the bezel region NA and then curing the adhesive after exposure to light.

Figure 4:
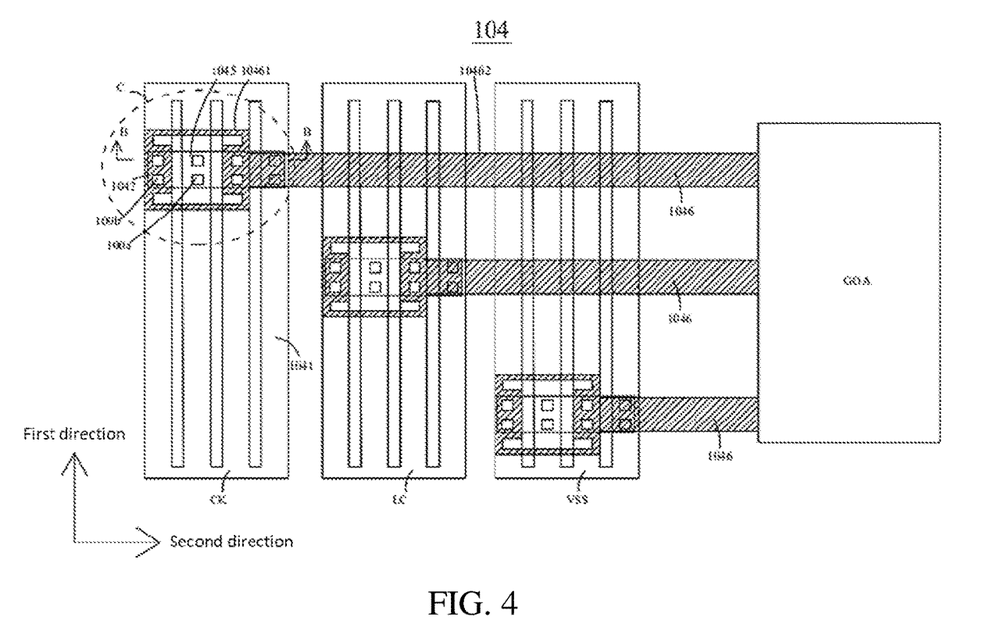
FIG. 4 is a schematic partial view of the gate drive circuit shown in FIG. 3.

Please refer to FIG. 4. FIG. 4 is a schematic partial view of the gate drive circuit shown in FIG. 3. The gate drive circuit 104 includes various signal lines and a plurality of gate drive units GOA, etc. The various signal lines include a plurality of clock signal lines CK, a low-potential power supply signal line VSS, and a low-frequency signal line LC. The clock signal lines CK, the low-potential power signal lines VSS, and the low-frequency signal lines LC all extend along the first direction and are arranged side by side along the second direction. The clock signal lines CK, the low-frequency signal lines LC, the low-potential power signal lines VSS, and the gate drive unit GOA are sequentially arranged in the second direction from a position away from the display area AA to a position close to the display area AA. The low-potential power signal lines VSS, the low-frequency signal lines LC, and the clock signal lines CK are all electrically connected to the gate drive unit GOA. The clock signal lines CK are used for transmitting clock signals. The low-potential power signal lines VSS are used for transmitting low-potential power signals. The low-frequency signal lines LC are used for transmitting low-frequency signals. The gate drive unit GOA is used for receiving low frequency signals, potential power signals, low-frequency signals, clock signals, etc. and for generating gate control signals.

The gate drive circuit 104 further includes branched signal lines 1046 electrically connected to various signal lines and the gate drive unit GOA. The branched signal lines 1046 extend along the second direction and are arranged along the first direction. The transparent conductive block 1045 is electrically connected to various signal lines through the first via hole 100a. The transparent conductive block 1045 is electrically connected to the branched signal line 1046 through the second via hole 100b, i.e., the transparent conductive block 1045 bridges various signal lines and branched signal line 1046.

In the present disclosure, any one of the clock signal lines CK, the low-potential power signal lines VSS, or the low-frequency signal lines LC includes at least two electrically connected first wires 1041 arranged side by side in the second direction. Therefore, in the case that the area occupied by any one of the clock signal lines CK, the low-potential power signal lines VSS, or the low-frequency signal lines LC remains substantially unchanged relative to the area occupied by the conventional signal lines, the space in the second direction is ensured to be fully used for the disposition of the signal lines, thereby reducing the space occupied by the signal line in the first direction. Accordingly, relative to the conventional technology, the number of first via holes 100a in the second direction is increased, and the number of first via holes 100a in the first direction is reduced, thereby ensuring conduction between the transparent conductive block 1045 and various signal lines. In addition, each branched signal line 1046 includes at least two electrically connected second wires 1042 arranged side by side in the second direction. Therefore, in case that the area occupied by each branched signal line 1046 remains unchanged relative to the area occupied by the conventional branched signal line, the space in the second direction is fully used for the disposition of the branched signal lines 1046, thereby reducing the space occupied by the branched signal lines 1046 in the first direction. Accordingly, the number of second via holes 100b in the second direction is increased, and the number of the second via holes 100b in the first direction is reduced, thereby ensuring conduction between the transparent conductive block 1045 and the branch signal line 1046.

Any one of the clock signal line CK, the low-potential power signal line VSS, or the low-frequency signal line LC is a conductive rectangular strip having at least one slit. Specifically, any one of the clock signal line CK, the low-potential power signal line VSS, or the low-frequency signal line LC includes at least two first wires 1041 arranged side by side along the second direction and connected to each other. Each first wire 1041 extends along the first direction. A gap is defined between two adjacent first wires 1041 to ensure an aperture ratio so that the sealant can be fully cured. The number of first wires 1041 contained in any one of the clock signal line CK, the low-potential power signal line VSS, or the low-frequency signal line LC is an even number, such as 2, 4, 6, 8, etc.

Each branched signal line 1046 includes a first connection line 10461 and a second connection line 10462. The first connection line 10461 and the second connection line 10462 are arranged in the same layer. The second connection line 10462 is connected between the first connection line 10461 and the gate driver units GOA. Each first connecting wire 10461 includes at least two second wires 1042 extending along the first direction and arranged side by side in the second direction. At least two second wires 1042 of each first connecting wire 10461 are connected to each other. A gap is defined between two adjacent second wires 1042 to ensure the aperture ratio, so that the sealant is sufficiently cured.

The transparent conductive block 1045 that bridges the clock signal line CK and the branched signal line 1046 is used as an example in the following description.

Figure 5:
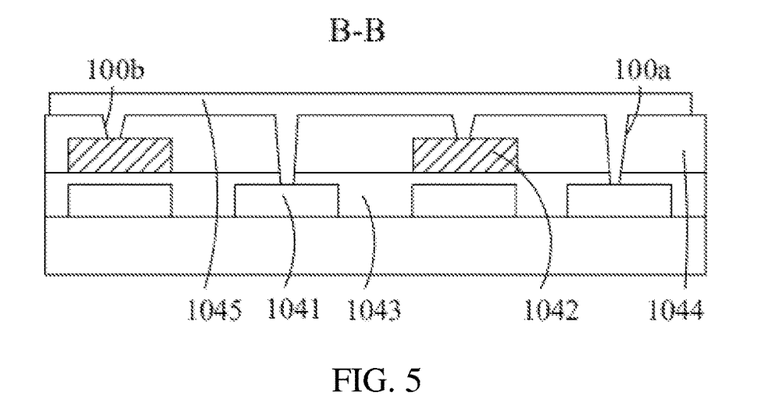
FIG. 5 is a schematic cross-sectional view taken along line B-B of FIG. 4.
Figure 6:
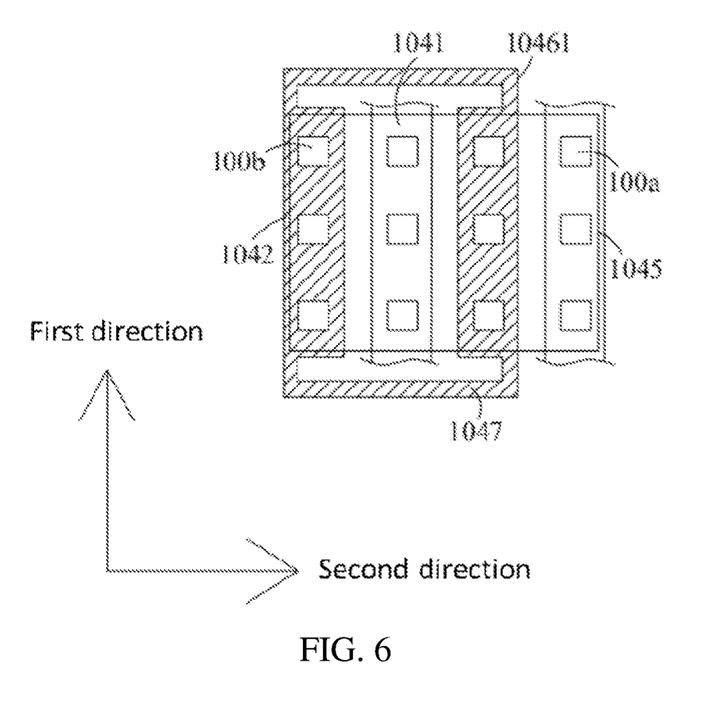
FIG. 6 is a schematic partial enlarged view of the gate drive circuit C shown in FIG. 4.
Figure 7:
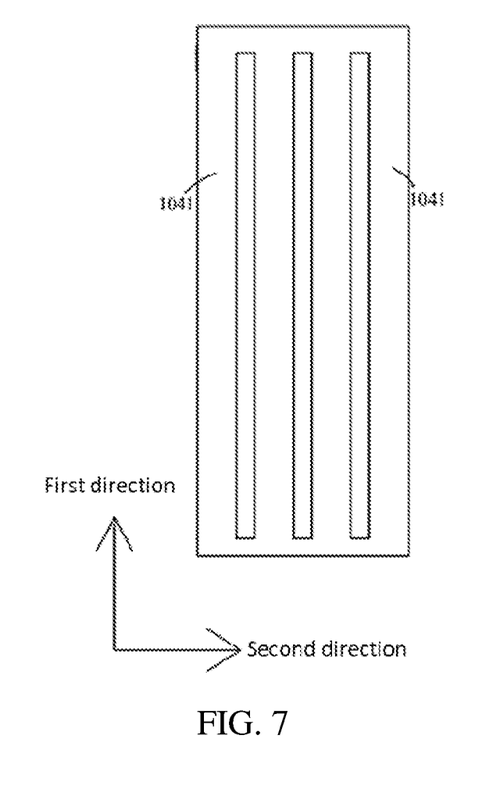
FIG. 7 is a schematic plan view of the clock signal line shown in FIG. 4.

Please refer to FIGS. 5, 6, and 7. FIG. 5 is a schematic cross-sectional view taken along line B-B of FIG. 4. FIG. 6 is a schematic partial enlarged view of the gate drive circuit C shown in FIG. 4. FIG. 7 is a schematic plan view of the clock signal line shown in FIG. 4.

Each clock signal line CK includes a plurality of first wires 1041. The first wires 1041 extend along the first direction and are arranged side by side along the second direction. The first wires 1041 are arranged in the bezel region NA. At least two first wires 1041 are electrically connected to each other. An angle between the first direction and the second direction is greater than 0 degrees, so that the space occupied by the first wire 1041 in the second direction is increased and the space occupied in the first direction is reduced, even if the first wire 1041 arranged in the first direction in the conventional technology is divided and arranged in the second direction.

Specifically, the angle between the first direction and the second direction is equal to 90 degrees. The first direction is a length direction of the bezel region NA. The second direction is a width direction of the bezel region NA. As shown in FIG. 7, a plurality of first wires 1041 are arranged side by side along the second direction. Each first wire 1041 is a rectangular wire. A width of each first wire 1041 ranges from 40 μm to 80 μm, such as 60 μm. A width of the gap between two adjacent first wires 1041 ranges from 20 μm to 40 μm, such as 30 μm, so as to ensure a sufficient aperture ratio, so that the sealant 103 is fully cured. Corresponding ends of four adjacent first wires 1041 in the second direction are all connected to each other, so that the four adjacent first wires 1041 are electrically connected to each other to form a conductive rectangular strip with three slits. A manufacturing material of the first wire 1041 is selected from the group consisting of molybdenum, aluminum, titanium, and copper. The first wire 1041 and the gate of the thin film transistor in the display area AA are arranged in the same layer, and both are manufactured by patterning a first metal layer.

The first insulating layer 1043 is located on one side of the first wires 1041. The first insulating layer 1043 is used for insulating the film layer where the first wires 1041 are positioned from the film layer where the second wires 1042 are positioned. Specifically, the first insulating layer 1043 covers the first wires 1041. A manufacturing material of the first insulating layer 1043 is selected from the group consisting of silicon nitride and silicon oxide. The first insulating layer 1043 is a gate insulating layer.

Each branched signal line 1046 includes a first connection line 10461 and a second connection line 10462. Each first connection line 10461 includes a plurality of second wires 1042. The second wires 1042 extend along the first direction and along the second direction and are arranged side by side. The second wires 1042 are arranged in the bezel region NA and positioned on one side of the first insulating layer 1043 away from the first wires 1041. At least two second wires 1042 are electrically connected to each other. Because at least two second wires 1042 in the second direction are electrically connected to each other, the part of the second wires 1042 that is arranged in the first direction in the conventional technology can be arranged in the second direction. The second wires 1042 and a source electrode and a drain electrode of the thin film transistor in the display area AA are arranged in the same layer and both are manufactured by patterning a second metal layer.

Specifically, a plurality of second wires 1042 are disposed on the first insulating layer 1043. One of the first wires 1041 is disposed between two adjacent second wires 1042 in the second direction. Each of the first wires 1041 corresponds to a second wire 1042 adjacent to the first wire 1041 in the second direction, so that an impedance is small when each of the first wires 1041 is electrically connected the second wires 1042 adjacent to the first wire 1041 in the second direction.

One second wire 1042 is disposed corresponding to one first wire 1041 in the thickness direction of the display panel 100. A width of each first wire 1041 is equal to the a of each second wire 1042, so that a width of the distance between the adjacent second wire 1042 and the first wire 1041 in the second direction is equal to a width between two adjacent first wires 1041, thereby ensuring the aperture ratio. The width of each second wire 1042 ranges from 40 μm to 80 μm, such as 60 μm. A manufacturing material of the second wire 1042 is at least one of molybdenum, aluminum, titanium, or copper.

It is noted that gaps are defined between the second wires 1042 in the second direction, between the first wires 1041 in the second direction, and between the first wires 1041 and the second wires 1042 that are adjacent in the second direction, thereby ensuring the aperture ratio of the first wiring 1041 and the second wiring 1042 to ensure that the sealant is fully cured. In addition, a length of each second wire 1042 along the first direction is less than a length of each first wire 1041 along the first direction. Because a plurality of second wires 1042 are also required to be arranged along the first direction and are arranged on the display panel 100 along the thickness direction corresponding to the first wire 1041, which leads to a problem of insufficient space for defining the via holes in the first direction.

In the present embodiment, two adjacent second wires 1042 in the second direction are electrically connected by at least one connecting wire 1047, so as to achieve the conductivity between the two adjacent second wires 1042 in the second direction.

Specifically, the two adjacent second wires 1042 in the second direction are electrically connected by two connecting wires 1047. Each end of each connecting wire 1047 is connected to a corresponding end of the two adjacent second wires 1042. The two connecting wires 1047 that are electrically connected to the two adjacent second wires 1042 are symmetrically arranged with respect to a symmetry axis of the second wire 1042 parallel to the second direction. By electrically connecting two adjacent second wires 1042 in the second direction by two connecting wires 1047, the conductivity between two adjacent second wires 1042 in the second direction is further increased.

In the present embodiment, the connecting wires 1047 and the second wires 1042 are arranged in the same layer. A width of each connecting wire 1047 is ranges from 5 µm to 15 µm, such as 12 µm, so as to ensure the conductivity between two adjacent second wires 1042.

The second insulating layer 1044 is positioned on one side of the second wires 1042 away from the first insulating layer 1043. Specifically, the second insulating layer 1044 covers the first insulating layer 1043 and the second wires 1042. A manufacturing material of the second insulating layer 1044 is selected from the group consisting of silicon nitride and silicon oxide. The second insulating layer 1044 is an interlayer insulating layer.

A plurality of first via holes 100a pass through the first insulating layer 1043 and the second insulating layer 1044, and are formed corresponding to the first wires 1041. The second via holes 100b pass through the second insulating layer 1044 and are formed corresponding to the second wires 1042.

At least one transparent conductive block 1045 is positioned on one side of the second insulating layer 1044 away from the second wires 1042. The same transparent conductive block 1045 is electrically connected to at least one first wire 1041 through the first via hole 100a, and is electrically connected to the second wire 1042 corresponding to at least one first wire 1041 through the second via hole 100b. Therefore, the transparent conductive block 1045 bridges the first wire 1041 and the second wire 1042 by a sufficient number of the first via holes 100a and the second via holes 100b. The conductivity between the first wire 1041 and the second wire 1042 is ensured, so that the clock signal line CK and the branched signal line 1046 are electrically connected to each other.

Specifically, the same transparent conductive block 1045 is electrically connected to two adjacent first wires 1041 in the second direction through the first via hole 100a, and is electrically connected to the adjacent two first wires 1041 in the second direction corresponding to the two second wires 1042 in the second direction through the second via hole 100b. A manufacturing material of the transparent conductive block 1045 is indium tin oxide. The transparent conductive block 1045 and the pixel electrode of the display area AA are arranged in the same layer and are obtained by patterning an indium tin oxide layer.

In the present embodiment, the sealant 104 is disposed in the bezel region NA and is positioned on one side of at least one transparent conductive block 1045 away from the second insulating layer 1044, i.e., the sealant 104 is positioned directly on the first wires 1041 and the second wires 1042.

By electrically connecting at least two first wires in the second direction and electrically connecting at least two second wires in the second direction, the display panel of the present disclosure fully uses the space in the second direction to arrange the first wires and the second wires. The space occupied by the first wires and the second wires in the first direction is reduced, so that the number of the first via holes corresponding to the first wires and the number of the second via holes corresponding to the second wires in the second direction are increased, and the number of the first via holes corresponding to the first wires and the number of the second via holes corresponding to the second wires in the first direction are decreased to ensure the numbers of the first via holes corresponding to the first wires and the number of the second via holes corresponding to the second wires, thereby ensuring the conductivity of the transparent conductive block that bridges the first wires and the second wires by the first via holes and the second via holes. In addition, the first wires and the second wires are staggered in the second direction to ensure an aperture ratio between the first wires and the second wires, which is beneficial to the sufficient curing of the sealant.

The descriptions of the above embodiments are only used for understanding technical solutions and core ideas of the present disclosure. People with ordinary skill in the art should understand that they can still modify the technical solutions described in the foregoing embodiments or equivalently replace some of the technical features. These modifications or replacements do not make the principle of the corresponding technical solutions to be depart from the scope of the technical solutions of the embodiments of the present disclosure.

The invention claimed is:

1. A display panel, comprising a bezel region, wherein the display panel comprises:
   a plurality of first wires extending along a first direction and arranged side by side along a second direction, wherein the first wires are disposed in the bezel region, and at least two of the first wires are electrically connected to each other;
   a first insulating layer positioned on one side of the first wires;
   a plurality of second wires extending along the first direction and arranged side by side along the second direction, wherein the second wires are disposed in the bezel region and are positioned on one side of the first insulating layer away from the first wires, and at least two of the second wires are electrically connected to each other;
   a second insulating layer positioned on a side of the second wires away from the first insulating layer;
   a plurality of first via holes passing through the first insulating layer and the second insulating layer, wherein the first via holes are defined corresponding to the first wires;
   a plurality of second via holes passing through the second insulating layer, wherein the second via holes are defined corresponding to the second wires;

at least one transparent conductive block positioned on one side of the second insulating layer away from the second wires, wherein the same transparent conductive block is electrically connected to at least one of the first wires through the first via hole and is electrically connected to at least one of the second wires corresponding to the first wires through the second via hole; and a sealant disposed in the bezel region and positioned on one side of the at least one transparent conductive block away from the second insulating layer;

wherein a width of each of the first wires is equal to a width of each of the second wires.

2. The display panel according to claim 1, wherein one of the first wires is positioned between adjacent two of the second wires in the second direction, and each of the first wires corresponds to one of the second wires adjacent to the first wire in the second direction.

3. The display panel according to claim 2, further comprising at least one connecting wire disposed in the bezel region, and the two adjacent second wires in the second direction are electrically connected to each other by the at least one connecting wire.

4. The display panel according to claim 3, wherein the connecting wire and the second wires are positioned on a same layer.

5. The display panel according to claim 3, wherein the two adjacent second wires in the second direction are electrically connected to each other by two connecting wires, both ends of each of the connecting wires are connected to a corresponding end of the two adjacent second wires, the two connecting wires that are electrically connected to the two adjacent second wires are symmetrically arranged with respect to a symmetrical axis of the second wires parallel to the second direction, and an included angle between the first direction and the second direction is equal to 90 degrees.

6. The display panel according to claim 3, wherein a width of each of the connecting wires ranges from 5 μm to 15 μm.

7. The display panel according to claim 2, wherein the same transparent conductive block is electrically connected to adjacent two of the first wires in the second direction through the first via hole, and is electrically connected to the two adjacent second wires in the second direction through the second via hole.

8. The display panel according to claim 2, wherein the width of each of the first wires ranges from 40 μm to 80 μm, the width of each of the second wires ranges from 40 μm to 80 μm, and a width of a distance between each of the first wires and the second wire adjacent to the first wire in the second direction ranges from 20 μm to 40 μm.

9. A display panel comprising a bezel region, wherein the display panel comprises:
a plurality of first wires extending along a first direction and arranged side by side along a second direction, wherein the first wires are disposed in the bezel region, and at least two of the first wires are electrically connected to each other;
a first insulating layer positioned on one side of the first wires;
a plurality of second wires extending along the first direction and arranged side by side along the second direction, wherein the second wires are disposed in the bezel region and are positioned on one side of the first insulating layer away from the first wires, and at least two of the second wires are electrically connected to each other;
a second insulating layer positioned on a side of the second wires away from the first insulating layer;
a plurality of first via holes passing through the first insulating layer and the second insulating layer, wherein the first via holes are defined corresponding to the first wires;
a plurality of second via holes passing through the second insulating layer, wherein the second via holes are defined corresponding to the second wires; and
at least one transparent conductive block positioned on one side of the second insulating layer away from the second wires, wherein the same transparent conductive block is electrically connected to at least one of the first wires through the first via hole and is electrically connected to at least one of the second wires corresponding to the first wires through the second via hole.

10. The display panel according to claim 9, wherein one of the first wires is positioned between adjacent two of the second wires in the second direction, and each of the first wires corresponds to one of the second wires adjacent to the first wire in the second direction.

11. The display panel according to claim 10, further comprising at least one connecting wire disposed in the bezel region, and the two adjacent second wires in the second direction are electrically connected to each other by the at least one connecting wire.

12. The display panel according to claim 11, wherein the connecting wire and the second wires are positioned on a same layer.

13. The display panel according to claim 11, wherein the two adjacent second wires in the second direction are electrically connected to each other by two connecting wires, both ends of each of the connecting wires are connected to a corresponding end of the two adjacent second wires, the two connecting wires that are electrically connected to the two adjacent second wires are symmetrically arranged with respect to a symmetrical axis of the second wires parallel to the second direction, and an included angle between the first direction and the second direction is equal to 90 degrees.

14. The display panel according to claim 11, wherein a width of each of the connecting wires ranges from 5 μm to 15 μm.

15. The display panel according to claim 10, wherein the same transparent conductive block is electrically connected to adjacent two of the first wires in the second direction through the first via hole, and is electrically connected to the two adjacent second wires in the second direction through the second via hole.

16. The display panel according to claim 10, wherein the width of each of the first wires ranges from 40 μm to 80 μm, the width of each of the second wires ranges from 40 μm to 80 μm, and a width of each distance between the first wire and the second wire adjacent to the first wire in the second direction ranges from 20 μm to 40 μm.

17. The display panel according to claim 9, wherein a width of each of the first wires is equal to a width of each of the second wires.

18. The display panel according to claim 9, wherein the display panel further comprises a sealant disposed in the bezel region and positioned on one side of the at least one transparent conductive block away from the second insulating layer.

* * * * *